United States Patent
Campet et al.

[11] Patent Number: 5,522,976
[45] Date of Patent: Jun. 4, 1996

[54] TARGET COMPONENT FOR CATHODE SPUTTERING

[75] Inventors: Guy Campet, Canejan; Jean-Michel Chabagno, Pau; Claude Delmas, Talence; Joseph Portier, Gradignan; Jean Salardenne, Pessac, all of France

[73] Assignee: Societe Nationale Elf Aquitaine, Courbevoie, France

[21] Appl. No.: 193,024

[22] PCT Filed: Sep. 1, 1992

[86] PCT No.: PCT/FR92/00835

§ 371 Date: Jun. 14, 1994

§ 102(e) Date: Jun. 14, 1994

[87] PCT Pub. No.: WO93/05195

PCT Pub. Date: Mar. 11, 1993

[30] Foreign Application Priority Data

Sep. 3, 1991 [FR] France .................. 91 10860

[51] Int. Cl.$^6$ .................. C23C 14/34; C04B 37/00; B22F 1/00
[52] U.S. Cl. .................. 204/298.13; 204/298.12; 156/89; 427/376.2; 264/60; 264/65; 264/66; 419/35; 419/37; 419/64; 419/39; 419/45; 419/48
[58] Field of Search .................. 204/298.12, 298.13; 419/9, 10, 35, 36, 37, 39, 40, 45, 48, 61, 63, 64; 156/89; 267/56, 60, 65, 66; 427/279, 374.7, 376.2

[56] References Cited

U.S. PATENT DOCUMENTS 3,791,955  2/1974  Klein .................. 204/298.12
4,341,816  7/1982  Lauterbach et al. .................. 204/192.12
4,421,628  12/1983  Quaderer .................. 204/192.12
4,783,613  11/1988  Yamamoto et al. .
5,086,351  2/1992  Coupot et al. .................. 204/192.1
5,190,630  3/1993  Kikuchi et al. .................. 204/298.12
5,244,556  9/1993  Inoue .................. 204/298.12

FOREIGN PATENT DOCUMENTS 55-165501  6/1979  Japan .................. 419/9
62-243762  10/1987  Japan .................. 204/298.12

*Primary Examiner*—R. Bruce Breneman
*Assistant Examiner*—Rodney G. McDonald
*Attorney, Agent, or Firm*—Oblon, Spivak, McClelland, Maier & Neustadt

[57] ABSTRACT

The target element (2) is formed from an inorganic compound layer (16) with a melting point above 300° C. deposited on a foam or metallic felt support layer such that the layer of inorganic compound sinks to part of its depth into the support layer to define a composite layer (17). In order to form the target element, a precursor system of the inorganic compound is applied to the support layer, the assembly so formed is subjected to a pressure of between 0.1 MPa and 15 MPa, the resulting assembly is maintained at between 300° C. and 1600° C. and below the melting temperature of the support in order to obtain a sintered assembly. Said assembly is than cooled to an ambient temperature avoiding any sudden cooling. In order to produce the target, the element (2) is glued to a metallic substrate (4) using a conductive adhesive.

35 Claims, 1 Drawing Sheet

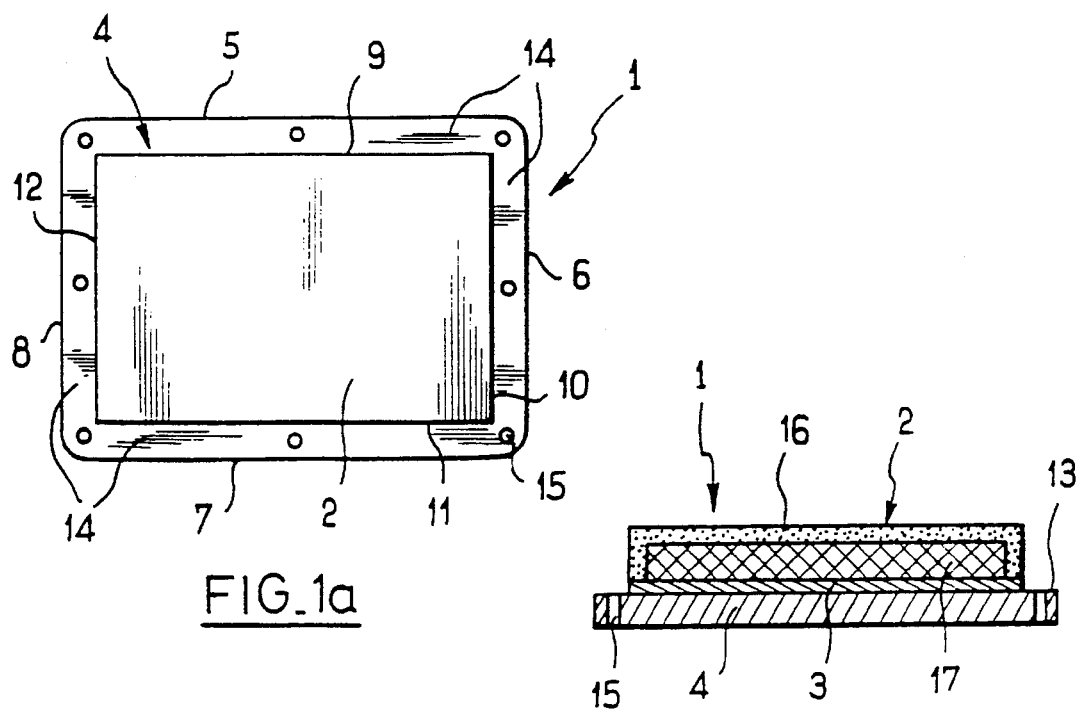
FIG_1a
FIG_1b
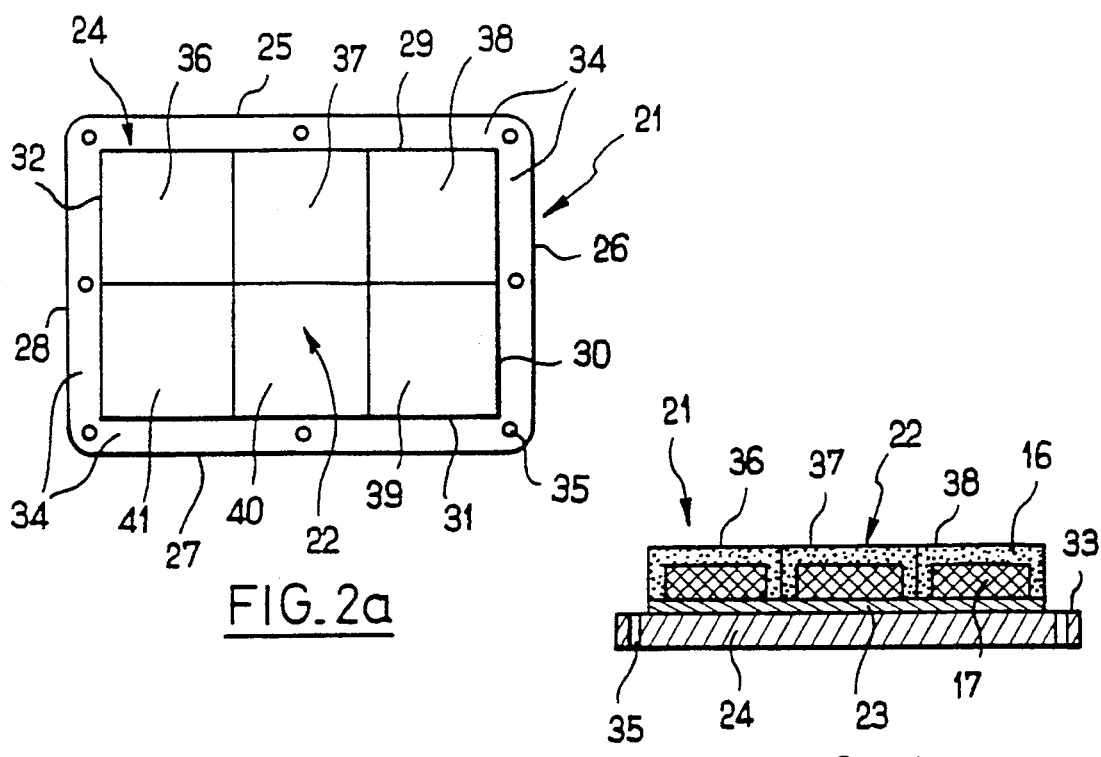
FIG_2a
FIG_2b

TARGET COMPONENT FOR CATHODE SPUTTERING

The invention relates to a target component for cathode sputtering. It relates further to a process for the preparation of the said component and also relates to targets, especially targets of large area, made from this component.

The coating of various materials using thin layers with special properties is undergoing considerable development at present. Particular mention may be made of the deposition of anticorrosion layers on metals, of antireflection layers on optical glasses, or of the deposition of ultrahard materials on mechanical components.

Many methods have been proposed for the production of such layers, the said methods depending, inter alia, on the nature of the compound(s) giving rise to the coating layer. Thus, when the said generating compounds are gaseous, various methods of chemical deposition in a vapour phase, unassisted or assisted by plasma, can be used. With liquid or soluble generating compounds it is possible to employ electrochemical methods if a layer of a metal is to be deposited, or else to employ methods such as those known as deposition with a spinner ("spin coating") or deposition by spraying a hot mist ("hot spray").

In the case where the source which gives rise to the coating is a solid material the method most widely employed for producing the coating is cathode sputtering.

In such a method the solid material generating the coating, which is usually referred to as "target material" or "target", and which may consist of a metal or a metal alloy or else of an inorganic chemical compound with a very high melting point, for example a ceramic or a refractory oxide, is bombarded with ions which have a sufficient energy to eject particles from the target material and the said particles are deposited on the object to be coated, forming the required coating on the latter.

For reasons of homogeneity and of rate of growth of the deposit formed by the particles ejected from the target material, the surface of the said target material to be deposited on the object must be of sufficient size. In the case of the coating of objects of large area, for example windows, it thus becomes necessary to employ targets of large area, whose area is advantageously larger than that of the object to be coated.

While the manufacture of targets of large area from metals or metal alloys does not present problems, this is no longer so when materials such as inorganic chemical compounds with a high melting point are involved. In fact, in the case of such materials the manufacture of the target involves the intermediate production of a ceramic or of a sintered product consisting of said materials. The production of a ceramic or of a sintered product of large area requires a step-by-step development of the most suitable process, such a development being in most cases protracted, difficult and consequently costly and, furthermore, it is essential that it be done by a specialist.

The invention proposes a target component for cathode sputtering, which makes it possible to produce targets of large area with ease, it being possible for the said component to be obtained by a simple, rapid and inexpensive process which can be carried out by persons who do not have any special competence in the art of ceramics or of sintering.

The target component for cathode sputtering which forms the subject of the invention is characterized in that it consists of a layer of an inorganic chemical compound with a melting point higher than 300° C., deposited on a support layer consisting of a metal foam or felt so that the layer of the inorganic compound enters, over at least a part of its thickness, the support layer to form with the latter a composite layer in which the inorganic compound and the support interpenetrate and whose thickness is smaller than or equal to that of the support layer.

Advantageously, the thickness e of the composite layer may represent 10% to 100% and preferably 50% to 100% of the total thickness $e_s$ of the support layer, that is to say of the sum of the thickness of the part of the support layer which is impregnated with inorganic compound and of the thickness of the part of the support layer which is free from inorganic compound.

Furthermore, the thickness e of the composite layer may represent 10% to 100% and preferably 20% to 80% of the total thickness $e_c$ of the layer where the inorganic compound is present, that is to say of the sum of the thickness of the part of the layer of inorganic compound which is situated outside the support and of the thickness of the part of the layer of inorganic compound contained in the support.

The metal foam or felt employed as support for the inorganic compound is made of a metal or metal alloy which is substantially inert towards the said inorganic compound. By way of nonlimiting examples of metal foams or felts which can be employed according to the invention there may be mentioned gold, platinum, nickel, titanium or copper foams or felts. The porosity of the metal foam or felt may vary quite widely and is in most cases higher than 90%.

The inorganic compound of the target component may be especially a metal oxide, sulphide, halide or oxyhalide whose melting point is higher than 300° C., the said inorganic compound being derived from one or more metals which may or may not be transition metals.

In particular the inorganic compound of the target component may correspond to either of the formulae $E_\alpha^k Z_\beta^p$ and $M_x^q T_y^n Z_z^p$, in which E denotes at least one metal of groups I to VIII of the Periodic Table of the elements, for example Fe, Cu, Co, Ni, Ti, Cr, Mo, Sn, W and In, M and T denote two different metals of groups I to VIII of the said Periodic Table, for example Li, Na, K, Ag, Cu and Tl in the case of M and Ni, Co, W, Mn, Fe, Cr, V and Ti in the case of T, Z is at least one element chosen from oxygen, sulphur, fluorine and chlorine, the symbols k, q, n and p denote the average oxidation states of the elements E, M, T and Z respectively, $\alpha$ and $\beta$ denote positive integers such that $\alpha k + \beta p = 0$ and x, y and z denote positive integers such that $qx + ny + pz = 0$.

The term average oxidation state, applied to each element, reflects the fact that the element in question may be in a number of oxidation states in the compound considered.

The inorganic compound may be especially an oxide and particularly an oxide which has either of the formulae $E_\alpha^k O_\beta^{2-}$ and $M_x^q T_y^n O_z^{2-}$, in which E is at least one metal of groups I to VIII of the Periodic Table of the elements, for example Fe, Cu, Co, Ni, W, Mo, Ti, Cr, Sn and In, M and T denote two different metals of the said Periodic Table, for example Li, Na, K, Ag, Cu and Tl in the case of M and Ni, Co, W, Mn, Cr, Fe, V and Ti in the case of T, the symbols k, q and n denoting the average oxidation states of E, M and T respectively, $\alpha$ and $\beta$ are positive integers such that $\alpha k - 2\beta = 0$ and x, y and z denote positive integers such that $qx + ny - 2z = 0$. As examples of such oxides there may be mentioned, no limitation being implied, $WO_3$, $MoO_3$, $Cr_2O_3$, $TiO_2$, $Fe_2O_3$, $Li_{2-v}NiO_2$ with $0 \leq v \leq 1$, $LiCrO_2$, $LiFeO_2$, $Li_2WO_4$.

The target component according to the invention may be obtained directly in the form of a target component of large area. It is also possible to produce target components which have a smaller area than the area of the target of large area to be obtained and then to assemble a plurality of such target components, as will be described later, to form a target component of large area.

A process for the production of a target component according to the invention, be it of large area or of smaller area, is characterized in that a system which is a precursor of the chosen inorganic compound is applied onto a support consisting of a layer of metal foam or felt, the assembly consisting of the support coated with the layer of inorganic compound precursor system is subjected to a pressure ranging from 0.1 MPa to 15 MPa and preferably from 0.1 MPa to 5 MPa, the resulting assembly is heated to a temperature of between 300° C. and 1600° C. and preferably between 600° C. and 1200° C. and capable of resulting in sintering of the said assembly, the said temperature being lower than the melting temperature of the support, and the said assembly is kept at the temperature reached for a sufficient period to obtain a sintered assembly, and the sintered assembly is then cooled to return it to ambient temperature, this cooling being performed so as to avoid any quenching phenomenon.

The system which is the precursor of the inorganic compound may consist of the inorganic compound itself, as is the case especially with the abovementioned compounds of formula $E_\alpha^k Z_\beta^p$ and especially in the case of the oxides of formula $E_\alpha^k O_\beta^{2-}$ such as those mentioned above The inorganic compound precursor system may also consist of a mixture of ingredients producing the inorganic compound envisaged by chemical reaction at the temperatures referred to above. Thus, when the inorganic compound consists of a compound of formula $M_x^q T_y^n Z_z^p$ and especially of an oxide of formula $M_x^q T_y^n Z_z^{2-}$, the inorganic compound precursor system may consist of a mixture, in appropriate proportions, of a compound of metal M and of a compound of metal T, which are capable of reacting at the temperatures defined above to form the compound $M_x^q T_y^n O_z^p$. For example, when the inorganic compound is an oxide of formula $M_x^q T_y^n O_z^{2-}$, that is to say a mixed oxide of the ceramic type, the precursor mixture of such an oxide may advantageously consist of a mixture of a carbonate of metal M of formula $M_x^q(CO_3)_{qx/2}$ and of an oxide of metal T of formula $T_y^n O_{ny/2}^{2-}$. Thus the inorganic compounds of the ceramic type of formulae $Li_2NiO_2$, $LiCrO_2$, $LiFeO_2$ and $Li_2WO_4$ are formed from a precursor mixture containing equimolar quantities of $Li_2CO_3$ and NiO, of $Li_2CO_3$ and $Cr_2O_3$, of $Li_2CO_3$ and $Fe_2O_3$ or of $Li_2CO_3$ and $WO_3$ respectively.

For its application onto the metal foam or felt support, the inorganic compound precursor system may be in the form of a powder with a particle size adapted to the porosity of the support. In this case the application of the inorganic compound precursor system onto the metal foam or felt support is performed by dusting the said support with the powder.

It is also possible to produce a coating paste by mixing the precursor system powder with one or more liquids such as water or an organic liquid, or else to prepare a gel from the pulverulent precursor system by any one of the conventional sol/gel techniques, and then to coat the metal foam or felt support with the said paste or the said gel.

As already indicated above, the metal foam or felt forming the support is preferably made of a metal or metal alloy which is substantially inert towards the inorganic compound and to its precursor system and, for example, of a metal such as gold, platinum, titanium, copper or nickel.

When the application of the inorganic compound precursor system onto the support is carried out by coating by means of moist products of the paste or gel type, the assembly originating from the coating of the support with the paste or the gel is advantageously subjected to a drying stage until a substantially dry product is obtained, before being subjected to the action of pressure (compression stage).

The compression of the assembly consisting of the support coated with the inorganic compound precursor system is carried out so as to produce a moderate crushing of the metal foam or felt support. The said compression is advantageously such that the thickness of the support layer after compression still represents at least 10% and preferably at least 50% of the initial thickness of the said support layer.

When the compressed assembly is heated to the temperature of between 300° C. and 1600° C. the rate of temperature rise is advantageously controlled to avoid heat shocks capable of resulting, inter alia, in cracking of the surface layer of the inorganic compound. Rates of temperature rise ranging from 0.05° C. to 30° C. per minute and more particularly from 0.1° C. to 15° C. per minute produce satisfactory results.

Similarly, when the assembly is being cooled from the temperatures of between 300° C. and 1600° C. to ambient temperature, excessively rapid cooling capable of resulting in quenching of the assembly during the cooling must be avoided. The operation may be advantageously carried out with cooling rates ranging from 0.05° C. to 30° C. per minute and more particularly from 0.1° C. to 15° C. per minute.

The target component according to the invention is adhesively bonded, on the side of the metal foam or felt support, onto a metal substrate, for example a brass, aluminium, titanium, copper, tungsten or stainless steel substrate, by means of a heat- and electrically conductive adhesive, to form a target which can be fitted into a cathode sputtering device.

According to the invention, a target component of large area, for example of the order of 400 cm² to 1 m², may be produced directly and the said component may be adhesively bonded as indicated above, onto a metal substrate of corresponding area to produce a target of large area.

It is also possible to produce a target of large area by producing target components according to the invention which have an area that is smaller than that of the target of large area to be produced, and then by adhesively bonding, as indicated above, a plurality of the said target components onto a metal substrate of area corresponding to that of the target of large area to be produced, the said target components being arranged connectively on the substrate to cover on this substrate an area corresponding to that desired for the target of large area.

Advantageously, in the case of targets of small, intermediate or large area which are obtained by adhesive bonding, carried out as indicated above, of one or a number of target components onto a metal substrate of appropriate area, the metal substrate has an area whose outline surrounds the outline of the single target component or of the target component resulting from the connective juxtaposition of target components of small area, the said outlines being preferably parallel to each other, so as to define, on the face of the metal substrate onto which the target component(s) is (are) adhesively bonded, a marginal region surrounding the target component. In this marginal region there may emerge orifices passing through the metal substrate and intended for the passage of fastening members, for example screws or the like, allowing the target to be fastened to a support member forming part of the cathode sputtering device.

On the attached drawing, FIGS. 1a and 1b show diagrammatically a top view (FIG. 1a) and a lengthwise section (FIG. 1b) of a target of large area obtained from a single target component which has a large area, and FIGS. 2a and 2b show diagrammatically a top view (FIG. 2a) and a lengthwise section (FIG. 2b) of a target of large area obtained from a plurality of target components of smaller area.

With reference to FIGS. 1a and 1b, a target 1 of large area comprises a target component 2 of large area which is in the shape of a rectangle, the said rectangle having, for example, a length of 30 cm and a width of 20 cm. The component 2 is integrally attached by a layer 3 of a heat and electrically conductive adhesive, for example a two-component epoxy conductive adhesive containing silver, to a metal substrate 4 whose dimensions are slightly larger than those of the rectangular component 2, so that the outline formed by the edges 5 to 8 of the rectangular metal substrate 4 surrounds the outline formed by the edges 9 to 12 of the rectangular target component 2 and is parallel to it, so as to define a marginal region 14 surrounding the said component 2 on the face 13 of the metal substrate onto which the component 2 is adhesively bonded. In this marginal region there emerge orifices such as 15 passing through the metal substrate and intended for the passage of fastening members, for example screws or the like, allowing the target 1 to be mounted on a support member forming part of the cathode sputtering device. The target component 2 is a component according to the invention, consisting of a layer 16 of an inorganic compound with a melting point higher than 300° C., especially ceramic or refractory oxide, integrally attached to a composite layer 17 consisting of a metal foam or felt and of the said inorganic compound so that the metal foam or felt and the inorganic compound interpenetrate over the whole thickness of the said composite layer, it being possible for the layer 16 also to coat the edges of the composite layer 17.

With reference to FIGS. 2a and 2b, a target 21 of large area comprises a target component 22 of large area, which is in the shape of a rectangle, for example a rectangle 30 cm in length and 20 cm in width, and results from the connective juxtaposition of six target components 36 to 41, each being in the shape of a square, for example with a 10 cm side. The target components 36 to 41, which form the target component 22 are integrally attached by a layer 23 of a heat- and electrically conductive adhesive, for example a two-component epoxy conductive adhesive containing silver, to a metal substrate 24 whose dimensions are slightly larger than those of the rectangular component 22 so that the outline formed by the edges 25 to 28 of the rectangular metal substrate 24 surrounds the outline formed by the edges 29 to 32 of the rectangular component 22 and is parallel to it, so as to define a marginal region 34 surrounding the said component 22 on the face 33 of the metal substrate onto which the target components 36 to 41 forming the component 22 are adhesively bonded. In this marginal region there emerge orifices such as 35 passing through the metal substrate and intended for the passage of fastening members, for example screws or the like, allowing the target 21 to be mounted on a support member forming part of a cathode sputtering device. The target components 36 to 41, whose connective assembly results in the component 22 of large area, are components according the invention, each consisting of a layer 16 of an inorganic compound with a melting point higher than 300° C., especially ceramic or refractory oxide, integrally attached to a composite layer 17 consisting of a metal foam or felt and of the said inorganic compound so that the metal foam or felt and the inorganic compound interpenetrate over the whole thickness of the composite layer, it being possible for the layer 16 also to coat the edges of the composite layer 17.

The use of a support consisting of a metal foam or felt in order to constitute the target components according to the invention makes it easily possible to obtain good mechanical behaviour of the target.

The invention is illustrated by the following examples which are given without any limitation being implied.

EXAMPLE 1

Indium oxide/tin oxide target component and corresponding target 14 g of indium oxide $In_2O_3$ and 1 g of tin oxide $SnO_2$ were placed in a mortar, the said oxides being in the form of powders with a particle size of between 10 µm and 100 µm. 10 g of water were then added to the content of the mortar and the whole was then mixed until a homogeneous paste was obtained. A plate in the shape of a square of 10 cm side was cut from a sheet of gold foam which had a mass per unit area of 1 $kg/m^2$ and a thickness between 1.7 and 2 mm and one of the faces of the foam plate was coated with the abovementioned paste, a spatula being employed to perform this coating. The said coating was continued until the foam was no longer visible. The assembly resulting from the coating was then subjected to a drying operation by being kept in an oven at 110° C. for 1 hour. The dried assembly was then placed in a press and compressed at ambient temperature in this press for one minute under the action of a pressure of 1 MPa. The compressed assembly was then placed in an oven and subjected in this oven to a heat treatment comprising a rise in the oven temperature from ambient temperature to 950° C. at a rate of 5° C./minute, then the said temperature of 950° C. being held for 6 hours and, lastly, a lowering of the oven temperature from 950° C. to ambient temperature at a rate of 5° C./minute. The various abovementioned operations were carried out under an atmosphere of atmospheric air (ambient atmosphere), At the end of the heat treatment an assembly was obtained forming the indium oxide/tin oxide target component and consisting of a layer of mixed indium tin oxide, with a thickness of 2 mm, integrally attached to a composite layer, with a thickness of 1 mm, in which the gold foam and the mixed indium tin oxide interpenetrate throughout the thickness of the foam layer.

The target component obtained as described above was adhesively bonded onto a stainless steel substrate in the shape of a square of 12 cm side, with the aid of a two-component epoxy conductive adhesive containing silver, so as to leave visible, on the face of the substrate carrying the target component, a marginal strip of 1 cm width, in which orifices were pierced for the passage of fastening members such as screws. A target was then obtained which had a structure comparable to that shown diagrammatically in FIGS. 1a and 1b, the said target having a working area (area of the target component) of 100 $cm^2$.

The target thus produced was employed in cathode sputtering for the production of a transparent thin deposit of mixed indium tin oxide on a glass support, the said deposit being usable in various electrochromic systems, in particular, as a transparent electrode. The transparent thin deposit obtained with this target was analysed and the absence of gold was noted in the deposit, which shows that the foam used as support for the mixed oxide does not appear at the surface,

EXAMPLE 2

Indium oxide/tin oxide target components and corresponding target of large area

Indium oxide/tin oxide target components were prepared by operating as described in Example 1, each having an area of 100 $cm^2$, the said components having the structure shown in Example 1.

Six target components thus obtained were adhesively bonded connectively, on the metal foam side, onto a stainless steel substrate in the shape of a rectangle 34 cm in length and 24 cm in width, with the aid of a two-component epoxy conductive adhesive containing silver, so as to occupy on the substrate an area of rectangular shape 30 cm in length and 20 cm in width and so as to leave visible, on the face of the substrate carrying the target components, a marginal strip of 2 cm width, in which orifices were pierced for the passage of fastening members such as screws. A target of large area was then obtained which had a structure comparable to that shown diagrammatically in FIGS. 2a and 2b, the said target having a working area (area occupied by the assembly of the target components) of 600 cm$^2$.

The target thus produced was employed in direct-current cathode sputtering for the production of a transparent thin deposit of mixed indium tin oxide on a glass support of large area. The transparent thin deposit obtained did not contain any trace of gold.

EXAMPLE 3

Tungsten oxide target component and corresponding target

The operation was carried out as in Example 1 but the indium and tin oxides were replaced with tungsten oxide $WO_3$ in the form of a powder with a particle size of between 10 μm and 100 μm, the said oxide being employed in a quantity of 10 g and by employing only 5 g of water to form the tungsten oxide paste.

At the end of the heat treatment an assembly was obtained forming the tungsten oxide target component and consisting of of a layer of tungsten oxide $WO_3$, with a thickness of 2 mm, integrally attached to a composite layer, with a thickness of 1 mm, in which the gold foam and $WO_3$ interpenetrate throughout the thickness of the foam layer.

The above target component was adhesively bonded, on the foam side, as described in Example 1, onto a tungsten substrate in the shape of a square of 12 cm side. A target was then obtained which had a structure comparable to that shown diagrammatically in FIGS. 1a and 1b, the said target having a working area of 100 cm$^2$.

EXAMPLE 4

Mixed lithium nickel oxide target component and corresponding target 3.7 g of lithium carbonate $Li_2CO_3$ and 7.5 g of nickel oxide NiO were placed in a mortar, the said carbonate and oxide being in the form of powders with a particle size of between 10 μm and 100 μm, and the whole was mixed until a homogeneous product was obtained.

A plate in the shape of a square of 10 cm side was cut from a sheet of copper foam which had a mass per unit area of 0.5 kg/m$^2$ and a thickness of approximately 2 mm and the pulverulent mixture of $Li_2CO_3$ and of NiO was dispersed on one of the faces of the foam plate. The resulting assembly was then placed in a press and compressed at ambient temperature in this press for five minutes under the action of a pressure of 1.5 MPa. The compressed assembly was then placed in an oven and was subjected in this oven to a heat treatment comprising a rise in the oven temperature from ambient temperature to 400° C. at a rate of 10° C. per minute, then the said temperature being held for 6 hours to decompose lithium carbonate completely, then a rise in the oven temperature to 850° C. at a rate of 10° C./minute, then the said temperature being held for 6 hours and, lastly, a lowering of the oven temperature from 850° C. to ambient temperature at a rate of approximately 10° C./minute. The various abovementioned operations were carried out under an atmosphere of atmospheric air.

At the end of the heat treatment an assembly was obtained forming the mixed lithium nickel oxide target component of formula $LiNiO_2$, the said assembly consisting of a layer of mixed oxide $LiNiO_2$ with a thickness of 2 mm, integrally attached to a composite layer, also with a thickness of 1 mm, in which the copper foam and the mixed oxide $LiNiO_2$ interpenetrate throughout the foam layer.

The target component obtained was adhesively bonded, on the foam side, as described in Example 1, onto a brass substrate in the shape of a square of 12 cm side. A target was then obtained which had a structure comparable with that shown diagrammatically in FIGS. 1a and 1b, the said target having a working area of 100 cm$^2$.

The target thus produced was employed in direct-current cathode sputtering for the production of a thin deposit of mixed lithium nickel oxide on a substrate. The thin deposit obtained did not contain any trace of copper, which shows that the foam used as support does not appear at the surface of the target component.

EXAMPLE 5

Mixed lithium chromium oxide target component and corresponding target

The operation was carried out as described in Example 4, but nickel oxide was replaced with 7.6 g of chromium oxide $Cr_2O_3$ and the copper foam with a nickel foam with a mass per unit area of 0.5 kg/m$^2$ and thickness of approximately 2 mm.

At the end of the heat treatment an assembly was obtained forming the mixed lithium chromium oxide target component, the said assembly consisting of a layer of mixed lithium chromium oxide, with a thickness of 3 mm, integrally attached to a composite layer, also with a thickness of 1 mm, in which the nickel foam and the mixed lithium chromium oxide interpenetrate throughout the thickness of the foam layer.

The target component obtained was adhesively bonded, on the foam side, as indicated in Example 1, onto a brass plate in the shape of a square of 12 cm side. A target was then obtained which had a structure comparable with that shown diagrammatically in FIGS. 1a and 1b, the said target having a working area of 100 cm$^2$.

The target thus produced was employed in cathode sputtering for the production of a thin deposit of mixed lithium chromium oxide on a substrate. The thin deposit obtained did not contain any trace of nickel, which shows that the foam used as support does not appear at the surface of the target component.

EXAMPLE 6

Mixed lithium iron oxide target component and corresponding target

The operation was carried out as described in Example 4, but with the following modifications:

8 g of iron oxide $Fe_2O_3$ were employed instead of nickel oxide, the copper foam was replaced with a gold foam which had a mass per unit area of 1 kg/m$^2$ and a thickness of approximately 2 mm, and after the decomposition of lithium carbonate the oven temperature was raised to 950° C.

At the end of the heat treatment an assembly was obtained forming the mixed lithium iron oxide target component, the said assembly consisting of a layer of mixed lithium iron oxide with a thickness of 2.5 mm, integrally attached to a composite layer, also with a thickness of 1 mm, in which the gold foam and the mixed lithium iron oxide interpenetrate throughout the thickness of the foam layer.

The target component obtained was adhesively bonded, on the foam side, as indicated in Example 1, onto an aluminium plate in the shape of a square of 12 cm side. A target was then obtained which had a structure comparable with that shown diagrammatically in FIGS. 1a and 1b, the said target having a working area of 100 cm².

The target thus produced was employed in cathode sputtering for the production of a thin film of mixed lithium iron oxide. The thin film obtained did not contain any trace of gold.

EXAMPLE 7

Mixed lithium tungsten oxide target components and corresponding targets:

Two tests (A and B) were performed to produce mixed lithium tungsten oxide target components by operating as described in Example 5, but replacing the mixture of lithium carbonate and chromium oxide with a pulverulent mixture which had a particle size of between 10 μm and 100 μm and containing 3.7 g of lithium carbonate and 46 g of WO₃ in the case of test A and 7.4 g of lithium carbonate and 46 g of WO₃ in the case of test B.

At the end of the heat treatment assemblies were obtained forming the lithium tungsten oxide target components, each of the said assemblies consisting of a layer of mixed lithium tungsten oxide with a thickness of 2 mm (test A) or 2.5 mm (test B), integrally attached to a composite layer, with a thickness of 1 mm (test A and test B), in which the nickel foam and the mixed lithium tungsten oxide interpenetrate and whose thickness represents the whole of the thickness of the foam layer. Each of the target components obtained was adhesively bonded, on the foam side, as indicated in Example 1, onto a plate of tungsten in the shape of a square of 12 cm side. Targets were obtained which had a structure comparable with that shown diagrammatically in FIGS. 1a and 1b, the said targets having a working area of 100 cm².

We claim:

1. A target component for cathode sputtering consisting of a layer having a total thickness $e_c$ and made of an inorganic chemical compound with a melting point higher than 300° C., said layer being deposited on a support layer having a total thickness $e_s$ and consisting of a metal foam or metal felt, so that the layer of the inorganic chemical compound enters the support layer to form with the metal foam or metal felt a composite layer of thickness e in which the inorganic chemical compound and the support layer interpenetrate, said thickness e amounting to 10% to 100% of the total thickness $e_c$ of the layer of the inorganic chemical compound and to 10% to 100% of the total thickness $e_s$ of the support layer.

2. The target component according to claim 1, wherein the thickness e of the composite layer amounts to 50% to 100% of the total thickness $e_s$ of the support layer.

3. The target component according to claim 1, or 2, wherein the thickness e of the composite layer amounts 20% to 100% of the total thickness $e_c$ of the layer of the inorganic chemical compound.

4. The target component according to claim 1, wherein the metal foam or metal felt employed as the support layer for the inorganic chemical compound is made of a metal or metal alloy which is substantially inert towards said inorganic chemical compound.

5. The target component according to claim 1, wherein the support layer for the inorganic chemical compound is made of a gold, platinum, nickel, titanium or copper foam or felt.

6. The target component according to claim 1, wherein the metal foam or metal felt has a porosity higher than 90%.

7. The target component according to claim 1, wherein the inorganic chemical compound is a metal oxide, sulphide, halide or oxyhalide having a melting point higher than 300° C., said inorganic chemical compound being derived from one or more metals.

8. The target component according to claim 7, wherein the inorganic chemical compound has the formula $E_\alpha^k Z_\beta^p$ or $M_x^q T_y^n Z_z^p$, in which E is at least one metal selected from the group consisting of Fe, Cu, Co, Ni, Ti, Cr, Mo, W, Sn and In, M is a metal selected from the group consisting of Li, Na, K, Ag, Cu and Tl, T is a metal selected from the group consisting of Ni, Co, W, Mn, Fe, Cr, V and Ti, Z is at least one element selected from the group consisting of oxygen, sulphur, fluorine and chlorine, the symbols k, q, n and p denote the average oxidation states of the elements E, M, T and Z, respectively, α and β are positive integers such that $\alpha k + \beta p = 0$, and x, y and z denote positive integers such that $qx + ny + pz = 0$.

9. The target component according to claim 7, wherein the inorganic chemical compound is a metal oxide having the formula $E_\alpha^k O_\beta^{-2}$ or $M_x^q T_y^n O_z^{-2}$, in which E is at least one metal selected from the group consisting of Fe, Cu, Co, Ni, W, Mo, Ti, Cr, Sn and In, M is a metal selected from the group consisting of Li, Na, K, Ag, Cu and Tl, T is a metal selected from the group consisting of Ni, Co, W, Mn, Cr, Fe, V and Ti, the symbols k, q and n denote the average oxidation states of E, M and T, respectively, α and β are positive integers such that $\alpha k - 2\beta = 0$, and x, y and z are positive integers such that $qx + ny - 2z = 0$.

10. A process for the preparation of a target component for cathode sputtering, which comprises:

a) applying onto a support consisting of a layer of metal foam or metal felt having a porosity precursor system which is a precursor of an inorganic chemical compound with a melting point higher than 300° C. to form an assembly comprised of the support coated with the precursor system, b) subjecting the assembly from step a) to a pressure of from 0.1 MPa to 15 MPa to form a pressure treated assembly in which the metal foam or metal felt layer has a thickness which represents at least 10% of the initial thickness of said metal foam or metal felt layer, c) heating the pressure treated assembly to a temperature of between 300° C. and 1600° C. effective to result in sintering of the pressure treated assembly, said temperature being lower than the melting temperature of the support, said heating being a rate ranging from 0.05° C. to 30° C. per minute, d) maintaining the heated assembly at the sintering temperature until a sintered assembly is formed, and e) cooling the sintered assembly to ambient temperature, said cooling being carried out at a rate of from 0.05° C. to 30° C. per minute so as to avoid any quenching phenomenon.

11. The process according to claim 10, wherein the pressure used to perform step b) is from 0.1 MPa to 5 MPa.

12. The process according to claim 10, wherein the temperature to which the pressure treated assembly is heated and at which the heated assembly is maintained is between 600° C. and 1200° C.

13. The process according to claim 10, wherein the precursor system which is the precursor of the inorganic chemical compound contains the inorganic chemical compound itself, said inorganic chemical compound having the formula $E_\alpha^k Z_\beta^p$ or $M_x^q T_y^n Z_z^p$, in which E is at least one metal selected from the group consisting of Fe, Cu, Co, Ni, Ti, Cr, Mo, W, Sn and In, M is a metal selected from the group consisting of Li, Na, K, Ag, Cu and Tl, T is a metal selected from the group consisting Ni, Co, W, Mn, Fe, Cr, V and Ti, Z is at least one element selected from the group consisting of oxygen, sulphur, fluorine and chlorine, the symbols k and p denote the average oxidation states of the elements E and Z, respectively, and $\alpha$ and $\beta$ are positive integers such that $\alpha k+\beta p=0$.

14. The process according to claim 10, wherein the inorganic chemical compound is an oxide having the formula $E_\alpha^k O_\beta^{-2}$ or $M_x^q T_y^n O_z^{-2}$, in which E is at least one metal selected from the group consisting of Fe, Cu, Co, Ni, W, Mo, Ti, Cr, Sn and In, M is a metal selected from the group consisting of Li, Na, K, Ag, Cu and Tl, T is a metal selected from the group consisting of Ni, CO, W, Mn, Cr, Fe, V and Ti, the symbols k, q and n denote the average oxidation states of E, M and T, respectively, $\alpha$ and $\beta$ are positive integers such that $\alpha k-2\beta=0$, and x, y and z are positive integers such that $qx+ny-2z=0$.

15. The process of claim 10, wherein the precursor system consists of a mixture of ingredients producing the desired inorganic chemical compound by chemical reaction at the sintering temperature.

16. The process according to claim 15, wherein the inorganic chemical compound is a compound of the formula $M_x^q T_y^n Z_z^p$, in which M is a metal selected from the group consisting of Li, Na, K, Ag, Cu and Tl, T is a metal selected from the group consisting of Ni, Co, W, Mn, Fe, Cr, V and Ti, Z is at least one element selected from the group consisting of oxygen, sulphur, fluorine and chlorine, the symbols q, n and p denote the average oxidation states of the elements M, T and Z, respectively, and x, y and z are positive integers such that $qx+ny+pz=0$, and wherein the precursor system consists of a mixture of a compound of metal M and of a compound of metal T which are capable of reacting at temperatures of between 300° C. and 1600° C. to form the compound $M_x^q T_y^n Z_z^p$.

17. The process according to claim 16, wherein the inorganic chemical compound is an oxide of the formula $M_x^q T_y^n O_z^{-2}$, in which M, T, q and n are as defined in claim 44, x, y and z are positive integers such that $qx+ny-2z=0$, and wherein the precursor system of said inorganic chemical compound consists of a mixture of a carbonate of the metal M of formula $M^{q'}_{x'}(CO_3)^{-2}_{q'x'/2}$ and of an oxide $T^{n'}_{y'}O^{-2}_{n'y'/2}$ of the metal T, where q' and n' denote the average oxidation states of elements M and T, respectively, and x' and y' are positive integers such that $q'x'-2q'x'/2=0$ and $n'y'-2n'y'/2=0$.

18. The process according to claim 10, wherein the precursor system is in the form of a powder with a particle size adapted to the porosity of the support and wherein the precursor system is applied onto the support by dusting said support with said powder.

19. The process according to claim 10, wherein the precursor system is in the form of a paste for coating or in the form of a gel and wherein the precursor system is applied onto the support by coating said support with said paste or said gel.

20. The process according to claim 19, wherein the assembly originating from the coating of the support with the paste or the gel is subjected to drying until a substantially dry product is obtained, before being subjected to pressure.

21. The process according to claim 10, wherein the pressure on the assembly consisting of the support coated with the precursor system is performed so that the thickness of the metal foam or metal felt layer after said pressure is applied is at least 50% of the initial thickness of said layer.

22. The process according to claim 10, wherein the heating of the pressure treated assembly to the temperature of between 360° C. and 1600° C. is carried out at a rate of from 0.10° C. to 15° C. per minute.

23. The process according to claim 10, wherein the cooling of the sintered assembly to ambient temperature is carried out at a rate of from 0.10° C. to 15° C. per minute.

24. Target for cathode sputtering consisting of a target component according to claim 1, the support layer of which is adhesively bonded onto a metal substrate by means of a heat and electrically conductive adhesive.

25. The target according to claim 24, consisting of a single target component having an area ranging from about 400 cm² to about 1 m², adhesively bonded onto a metal substrate of corresponding area.

26. The target according to claim 24, in the form of a target having a large area of from about 400 cm² to about 1 m² and consisting of a plurality of target components of an area smaller than that of said target of large area, which are adhesively bonded onto a metal substrate of an area corresponding to that of the target of large area and which are arranged connectively on the metal substrate to cover on the metal substrate an area corresponding to the desired area for the target of large area.

27. Target according to claim 24, wherein the metal substrate has an area whose outline surrounds the outline of the target component so as to define on the face of the metal substrate onto which the target component is adhesively bonded, a marginal region surrounding the target component.

28. Target according to claim 27, wherein in said marginal region orifices pass through the metal substrate for the passage of fastening members allowing the target to be fastened to a support member forming part of a cathode sputtering device.

29. Target for cathode sputtering consisting of a target component according to claim 7 or claim 8 or claim 9, the support layer of which is adhesively bonded onto a metal substrate of corresponding area by means of a heat and electrically conductive adhesive.

30. Target for cathode sputtering consisting of a single opponent according to claim 7 or claim 8 or claim 9, the support layer which is adhesively bonded onto a metal substrate of corresponding area by means of a heat and electrically conductive adhesive, said target component having an area of from about 400 cm² to about 1 m².

31. Target for cathode sputtering having a large area ranging from about 400 cm² to about 1 m² and consisting of a plurality of target components according to claim 7, or claim 8 or claim 9, having an area smaller than that of said target of large area, which are adhesively bonded to a metal substrate of area corresponding to that of the target of large area and which are arranged connectively on the said metal substrate to cover on this substrate an area corresponding to the desired area for the target of large area.

32. Target according to claim 26, wherein the metal substrate has an area whose outline surrounds the outline of a target component of large area resulting from the connective juxtaposition of the target components of small area so as to define on the face of the metal substrate onto which the target components of small area are adhesively bonded, a marginal region surrounding the target component.

33. The process according to claim 10, wherein the metal foam or metal felt employed as the support layer for the inorganic chemical compound is made of a metal or metal alloy which is substantially inert towards said inorganic chemical compound.

34. The process according to claim 10, wherein the support layer for the inorganic chemical compound is made of a gold, platinum, nickel, titanium or copper foam or felt.

35. The process according to claim 18, wherein the metal foam or metal felt has a porosity higher than 90%.

* * * * *

UNITED STATES PATENT AND TRADEMARK OFFICE
CERTIFICATE OF CORRECTION

PATENT NO. : 5,522,976
DATED : June 4, 1996
INVENTOR(S) : Guy CAMPET, et al.

It is certified that error appears in the above-indentified patent and that said Letters Patent is hereby corrected as shown below:

On the title page, Item [87], the PCT information, should read:

```
--[87]  PCT Pub. No.:  WO93/05195
        PCT Pub. Date: Mar. 18, 1993--
```

Signed and Sealed this

Twentieth Day of August, 1996

Attest:

BRUCE LEHMAN

*Attesting Officer*     *Commissioner of Patents and Trademarks*